Figure 1:
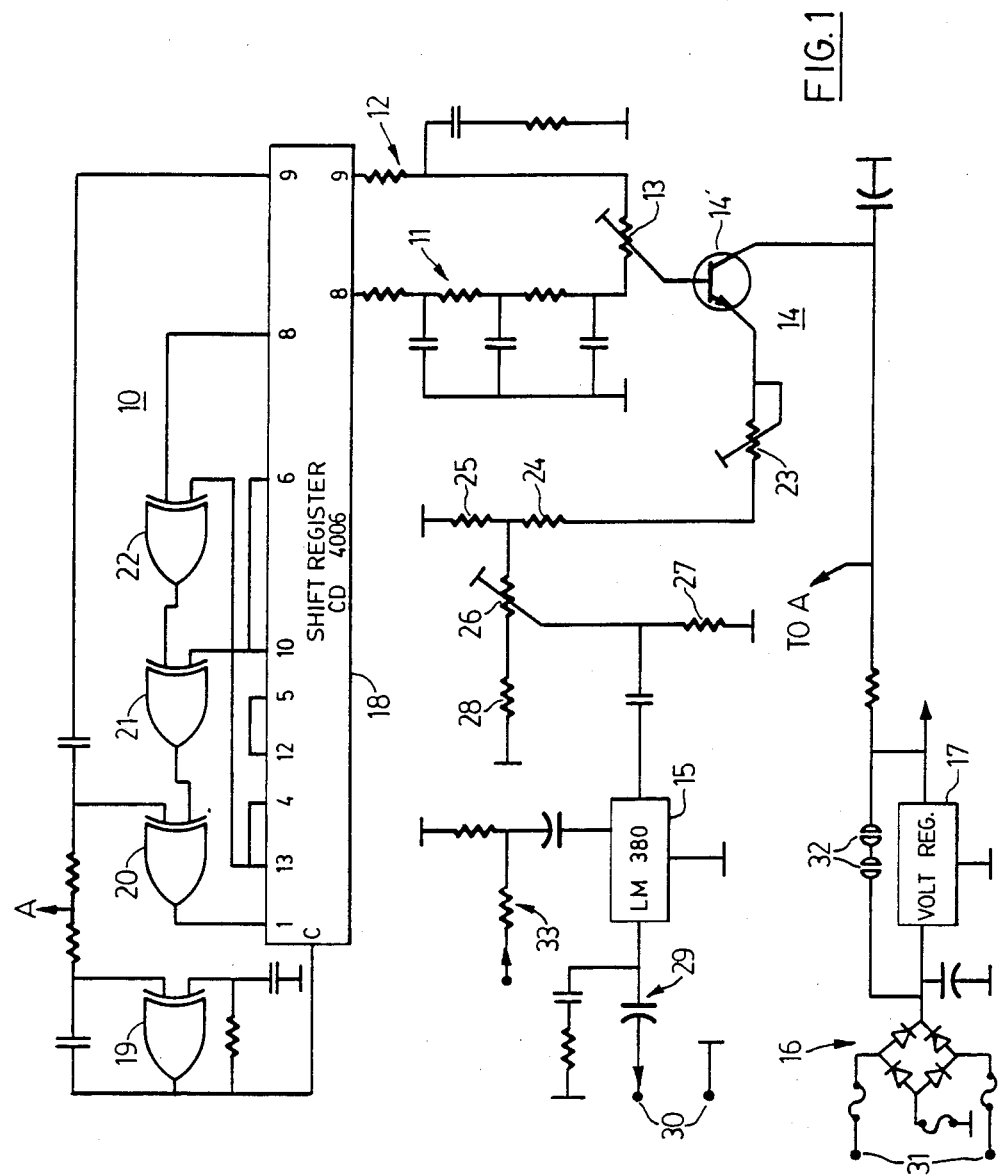

United States Patent [19]

Krause

[11] Patent Number: 4,914,706
[45] Date of Patent: Apr. 3, 1990

[54] MASKING SOUND DEVICE

[75] Inventor: Hans W. Krause, Oakville, Canada

[73] Assignee: 777388 Ontario Limited, Oakville, Canada

[21] Appl. No.: 290,375

[22] Filed: Dec. 29, 1988

[51] Int. Cl.⁴ .............................................. A61F 11/02
[52] U.S. Cl. .................................................. 381/73.1
[58] Field of Search ....................... 381/73.1; 364/717; 331/78

[56] References Cited

U.S. PATENT DOCUMENTS

| | | |
|---|---|---|
| 3,980,827 | 9/1976 | Sepmeyer et al. . |
| 4,010,324 | 3/1977 | Jarvis et al. . |
| 4,024,535 | 5/1977 | Goldstein . |
| 4,054,751 | 10/1977 | Calder et al. . |
| 4,059,726 | 11/1977 | Watters et al. . |
| 4,319,088 | 3/1982 | Orfield . |
| 4,348,597 | 9/1982 | Weber . |
| 4,438,526 | 3/1984 | Thomalla . |
| 4,476,572 | 10/1984 | Horrall et al. . |
| 4,674,124 | 6/1987 | Horrall et al. . |
| 4,691,291 | 9/1987 | Wolfram . |
| 4,748,576 | 5/1988 | Beker et al. . |
| 4,771,429 | 9/1988 | Davis et al. . |

OTHER PUBLICATIONS

An64-11 FIG. 24, National Semiconductor, May 1972.
Ward, Electronic Music Circuit Guidebook, 1975, p. 55.

Primary Examiner—Forester W. Isen
Attorney, Agent, or Firm—Ridout & Maybee

[57] ABSTRACT

A masking sound source for a sound masking system has adjustable preset means for adjusting the spectral shape of the sound produced. The source includes a random noise generator for producing white noise and having two incoherent outputs in which two low pass filters having different frequency response characteristics are connected. The filtered noise signals are applied to a potential divider forming a contour control device by which a composite noise signal having the requisite spectral shape is derived. This composite noise signal, after appropriate level adjustment, is applied to an output amplifier.

10 Claims, 1 Drawing Sheet

MASKING SOUND DEVICE

This invention relates to a masking sound source for use in a sound masking system.

Sound masking systems are widely used in open-plan offices and similar spaces where it is desirable to preserve speech privacy in a local area of the space while eliminating or diffusing unwanted sounds from other areas. Such systems operate on the principle of generating a spacially uniform background noise at an acoustic level such that it will mask other sounds so that they will not obtrude on the ear while itself remaining unobtrusive.

Sound masking systems are of two main types. There are those in which a centrally located noise generating source supplies a system of loudspeakers distributed at appropriate locations throughout the area to be covered, and there are those which employ individuallly self-contained sound masking packages which can be individually installed as required. The latter type of system has the important advantage that, since each unit is an independent noise source, phasing and balancing problems associated with a central system are eliminated. However, a single self-contained sound masking package can be employed as a master to drive a number of slave units.

For an effective sound masking system it is important that the quality of the sound generated, as determined by its spectral shape, should be suited to the requirements of the particular installation. While this can be achieved for a given installation, the requirements differ from one installation to another according to the sound absorption characteristics of surfaces in the area to be covered. Different sound qualities are generally required for different environments. Attempts have been made to deal with this problem by providing in the masking sound source additional filters which can be selectively switched into circuit for deriving, say, two alternative sound spectra. However, this arrangement is not ideal because it cannot be used to adjust the sound quality to the wide range of requirements which arise in practice.

The present invention overcomes the problem by providing a masking sound source, more particularly for a self-contained sound masking package, having adjustable preset means for adjusting the spectral shape of the generated noise, such means being preset at the factory or upon installation to meet a particular local requirement.

A masking sound source according to the invention comprises a random noise generating circuit having at least two outputs, and two low-pass filters having different frequency response characteristics connected to the two outputs. The outputs of the filters are connected to different inputs of a continuously adjustable contour control device to derive a composite noise signal whose spectral shape can be adjusted by adjustment of the device. The composite noise signal so derived is applied to an output power amplifier via an impedance transformer.

The noise generator is, for all practical purposes, a true random sequence generator and may comprise a multistage shift register, an oscillator supplying shift pulses to the shift register, and an exclusive-or network interconnecting the outputs of at least some of the stages with the input of the first stage. In this case the filters would be connected to the outputs of the last two stages of the shift register.

One embodiment of the invention will not be described, by way of example, with reference to the accompanying drawing, which shows a schematic circuit diagram of the device.

The masking sound source is primarily intended for a self-contained sound masking passage. The circuitry of the masking sound source, as illustrated in FIG. 1, basically comprises a random noise generating circuit 10, low pass filters 11, 12 having different frequency response characteristics, a continuously adjustable contour control device 13, an impedance transformer 14, and an output power amplifier 15. A power supply 16 provides power to the solid-state components of the device through a voltage regulator 17.

The noise generating circuit 10 consists essentially of a multi-stage shift register 18, which in the present example is a Motorola CD4006, an oscillator 19 connected to apply shift pulses to the shift register at approximately 12 Hz, and an exclusive-or network consisting of gates 20, 21, 22 (Motorola CD4070). The exclusive-or network provides a number of inputs, in this case four inputs, which are connected to the outputs of respective stages of the shift register 18, the gated output being applied to the input of the first stage of the shift register.

It will be noted that the noise generating circuit 10 is in fact a true random generator as distinguished from a pseudo-random generator. Accordingly the outputs of the noise generator avoid the periodicity characteristic of pseudo-random generators which gives rise to an obstrusive sound component. A further important feature of the noise generating circuit is that its two outputs are taken from different stages of the shift register 18 and are therefore incoherent outputs.

The low pass filters 11 and 12 are respectively connected to the outputs of the last two stages of the shift register 18. With the arrangement of the noise generator shown, the signals applied to the inputs of the filters are for all practical purposes random noise. Each of the filters is a resistance-capacitance ladder network, and since the filters 11, 12 have different frequency response characteristics one having a higher cut-off frequency than the other, each filter derives from the noise generator a different noise signal having its own predetermined spectral shape within the audio frequency range.

The contour control device 13 is a potential divider connected between the output ends of the filters 11, 12 and having a continuously adjustable tap whereby to derive a composite noise signal from the outputs of the filters. Thus, by adjusting the position of the tap of the device 13, one can adjust the spectral shape of the composite noise signal.

The impedance transformer 14 is formed by a transistor 14' connected as an emitter follower. The composite noise signal derived from the contour control device 13, is applied to the base of the transistor, the emitter circuit of which includes a variable resistor 23 providing a preset gain control covering the range of 1.5 db. The contour control device 13 and the gain control 23 are intended to be preset either in the factory or by the installer upon installation of the device, and are preferably located in the package so that they cannot easily be tampered with after installation.

The composite noise signal is tapped from the emitter circuit of the transistor 14' and applied to the power amplifier 15 through an attenuator network, the output of which is independent of load, formed by resistors 24, 25, 26, 27 and 28. The resistor 26 provides a multi-step logarithmic gain control whereby the user can adjust the level of the noise signal so as to set the output of the amplifier 15 at any one of a number of discrete output levels in 1.5 db steps. The power amplifier 15 is a conventional power amplifier chip, LM380, having an output circuit 29 with output terminals 30 for connection to a sound transducer such as a loudspeaker. The amplifier has an auxiliary input circuit 33 connected to pin 2 of the LM380 to receive paging signals.

The power supply 16 consists of a full wave bridge rectifier with input terminals 31 for connection to an A.C. source. The rectified output is applied to the voltage regulator 17, which is also a solid state device, LM340T15. If desired, the circuit can be energized from a D.C. source, the voltage regulator being bypassed by shorting the solder joints.

I claim:

1. A masking sound source for a sound masking system comprising a random noise generating circuit having at least two incoherent outputs, first and second low pass filters having different frequency response characteristics each connected to a respective one of said outputs for deriving a noise signal having a predetermined spectral shape within the audio frequency range, continuously adjustable contour control means connected to the filters for deriving from said noise signals a composite noise signal having a spectral shape corresponding to the setting of the continuously adjustable contour control means, and an impedance transformer having an input coupled to said contour control means to receive the composite noise signal, and having an output circuit, and power amplification means having an input circuit coupled to the output circuit of the impedance transformer and an output circuit providing terminals for connection to a loudspeaker.

2. A masking sound source according to claim 1, wherein the noise generating circuit includes a multistage shift register having at least two outputs connected to different stages thereof and to which the filters are connected.

3. A masking sound source according to claim 1, wherein the noise generating circuit comprises a multistage shift register having an input and a plurality of outputs connected to different stages thereof, an exclusive-or means having a plurality of inputs connected to respective outputs of said stages and an output connected to said input of the shift register, and an oscillator for supplying shift pulses to the shift register.

4. A masking sound source according to claim 3, said filters each having an input and an output, the inputs of the filters being connected respectively to the outputs of the last two stages of the shift register, and the outputs of the filters being connected to different inputs of the contour control means.

5. A masking sound source according to claim 4, wherein the contour control means comprises a potential divider connected across the outputs of the filters and having an adjustable tap connected to the input of the impedance transformer.

6. A masking sound source according to claim 5, wherein the impedance transformer is an emitter follower having an adjustable gain control element in its output circuit.

7. A masking sound source according to claim 6, wherein the input circuit of the power amplification means includes a multi-step, logarithmic gain control element for setting the output of the amplification means at any selected one of a plurality of discrete power levels.

8. A masking sound source according to claim 7, wherein the power amplification means comprises a solid state power amplifier having an auxiliary input connected to receive a paging input signal.

9. A masking sound source for a sound masking system, comprising:

a noise generating circuit having at least two incoherent outputs, first and second low pass filters having different frequency response characteristics, each filter having an input and an output, the input being connected to a respective output of the noise generating circuit for deriving therefrom a noise signal having a predetermined spectral shape within the audio frequency range, a potential divider connected across the outputs of the filters and having a continuously adjustable output tap, whereby to derive a composite noise signal having a spectral shape determined by setting the potential divider, an impedance transformer having an input connected to receive said composite noise signal and having an output circuit coupled to the input circuit of a power amplifier, the power amplifier providing output circuit means for connection to a loudspeaker.

10. A masking sound source according to claim 9, wherein the output circuit of the impedance transformer includes a continuously adjustable gain control element and the input circuit of the power amplifier includes a multi-step logarithmic gain control element for setting the output of the amplifier at any one of a plurality of discrete power levels.

* * * * *

UNITED STATES PATENT AND TRADEMARK OFFICE
CERTIFICATE OF CORRECTION

PATENT NO.  : 4,914,706

DATED       : April 3, 1990

INVENTOR(S) : Hans W. Krause

It is certified that error appears in the above-identified patent and that said Letters Patent is hereby corrected as shown below:

Column 2, line 21:  change "12 Hz" to -- 12 kHz --.

Signed and Sealed this

Thirtieth Day of June, 1992

*Attest:*

DOUGLAS B. COMER

*Attesting Officer*        *Acting Commissioner of Patents and Trademarks*